United States Patent
Isoyan et al.

(10) Patent No.: US 9,940,694 B2
(45) Date of Patent: Apr. 10, 2018

(54) RESOLUTION ENHANCEMENT TECHNIQUES BASED ON HOLOGRAPHIC IMAGING TECHNOLOGY

(71) Applicant: Synopsys, Inc., Mountain View, CA (US)

(72) Inventors: Artak Isoyan, Beaverton, OR (US); Lawrence S. Melvin, III, Hillsboro, OR (US)

(73) Assignee: Synopsys, Inc., Mountain View, CA (US)

( * ) Notice: Subject to any disclaimer, the term of this patent is extended or adjusted under 35 U.S.C. 154(b) by 348 days.

(21) Appl. No.: 14/720,646

(22) Filed: May 22, 2015

(65) Prior Publication Data

US 2015/0339802 A1    Nov. 26, 2015

Related U.S. Application Data

(60) Provisional application No. 62/002,730, filed on May 23, 2014.

(51) Int. Cl.
*G06K 9/00* (2006.01)
*G06T 3/40* (2006.01)
*G03F 1/36* (2012.01)
*G03F 7/20* (2006.01)

(52) U.S. Cl.
CPC .......... *G06T 3/40* (2013.01); *G03F 1/36* (2013.01); *G03F 7/70441* (2013.01)

(58) Field of Classification Search
CPC .......... G06T 3/40; G03F 1/36; G03F 7/70441
See application file for complete search history.

(56) References Cited

U.S. PATENT DOCUMENTS

| | | | | |
|---|---|---|---|---|
| 5,463,702 | A * | 10/1995 | Trueblood | G06T 9/00 348/391.1 |
| 6,621,928 | B1 * | 9/2003 | Inagaki | G06T 7/0006 348/86 |
| 6,992,783 | B1 * | 1/2006 | Sumiuchi | G06T 11/001 358/1.15 |
| 2002/0039209 | A1 * | 4/2002 | Parker | G02B 5/32 359/15 |
| 2005/0147895 | A1 * | 7/2005 | Chang | G03F 7/70291 430/5 |
| 2007/0041659 | A1 * | 2/2007 | Nobori | B60R 1/00 382/284 |

(Continued)

OTHER PUBLICATIONS

Kreuzer et al., Digital in-line holography, 2003, pp. 62-65.*

(Continued)

*Primary Examiner* — John Strege
(74) *Attorney, Agent, or Firm* — Park, Vaughan, Fleming & Dowler LLP; Laxman Sahasrabuddhe

(57) ABSTRACT

Systems and techniques for performing resolution enhancement on target patterns based on holographic imaging technique (HIT) are described. During operation, an electronic design automation (EDA) tool can compute an in-line hologram of the target patterns based on parameters associated with a photolithography process that is used in a semiconductor manufacturing process, wherein the semiconductor manufacturing process is to be used for printing the target patterns on a semiconductor wafer. Next, the EDA tool can determine the mask patterns based on the in-line hologram.

17 Claims, 4 Drawing Sheets

---

Compute an in-line hologram of target patterns based on parameters associated with a photolithography process that is used in a semiconductor manufacturing process to print the target patterns on a semiconductor wafer
402

Determine mask patterns based on the in-line hologram
404

(56) References Cited

U.S. PATENT DOCUMENTS

| | | | | |
|---|---|---|---|---|
| 2007/0188633 A1* | 8/2007 | Mandy | ................ | G06T 3/0018 |
| | | | | 348/241 |
| 2007/0258621 A1* | 11/2007 | Kato | ..................... | G01B 11/24 |
| | | | | 382/100 |
| 2008/0056558 A1* | 3/2008 | Mitsui | ...................... | G03F 1/86 |
| | | | | 382/144 |
| 2009/0013136 A1* | 1/2009 | Chi | .................... | H03M 13/275 |
| | | | | 711/157 |
| 2011/0020736 A1* | 1/2011 | Rakhovskiy | ............ | G03H 1/08 |
| | | | | 430/2 |
| 2011/0083183 A1* | 4/2011 | Freeman | .............. | G06F 21/566 |
| | | | | 726/24 |
| 2013/0297855 A1* | 11/2013 | Gupta | .................. | G06F 3/0656 |
| | | | | 711/103 |
| 2014/0164722 A1* | 6/2014 | Garthwaite | ............ | G06F 12/16 |
| | | | | 711/162 |
| 2015/0147684 A1* | 5/2015 | Heidt | ................ | G03F 7/70408 |
| | | | | 430/2 |
| 2015/0185697 A1* | 7/2015 | Rakhovsky | ......... | G03H 1/0891 |
| | | | | 359/9 |
| 2015/0378306 A1* | 12/2015 | Gurevich | ............ | G03H 1/0005 |
| | | | | 359/12 |

OTHER PUBLICATIONS

Kamon et al. Optical Proximity Correction for Super Resolution Technique, spie vol. 2512, 1995.*

Hsu et al. Implementation of phase-shift patterns using a holgraphic projection system with phase-only diffractive optical elements, Applied Optics, May 2011.*

* cited by examiner

RESOLUTION ENHANCEMENT TECHNIQUES BASED ON HOLOGRAPHIC IMAGING TECHNOLOGY

RELATED APPLICATION

This application claims priority to U.S. Provisional Patent Application No. 62/002,730, entitled "Optical Proximity Correction Using Holographic Imaging Technique," by the same inventors, filed on 23 May 2014, the contents of which are herein incorporated by reference in their entirety for all purposes.

BACKGROUND

Technical Field

This disclosure relates to electronic design automation (EDA). More specifically, this disclosure relates to resolution enhancement techniques (RETs) based on holographic imaging technology (HIT).

Related Art

Rapid advances in computing technology have made it possible to perform trillions of computational operations each second on data sets that are sometimes as large as trillions of bytes. These advances can be attributed to the dramatic improvements in semiconductor design and manufacturing technologies, which have made it possible to integrate tens of millions of devices onto a single chip.

As semiconductor design enters the deep submicron era, the computational efficiency and quality of results of RETs is becoming increasingly important. If an RET is computationally inefficient or produces poor quality of results, it can increase the time-to-market and/or decrease yield, which can cost millions of dollars in lost revenue. Hence, it is desirable to improve the computational efficiency and/or the quality of results of RETs.

SUMMARY

Embodiments disclosed herein feature RETs, e.g., optical proximity correction (OPC), assist feature (AF) placement, sub-resolution assist features (SRAF) placement, etc., based on holographic imaging technology (HIT). Some embodiments can compute an in-line hologram of the target patterns based on parameters associated with a photolithography process that is used in a semiconductor manufacturing process, wherein the semiconductor manufacturing process is to be used for printing the target patterns on a semiconductor wafer. Next, the embodiments can determine the mask patterns based on the in-line hologram.

In some embodiments, computing the in-line hologram can comprise computing a diffraction pattern that is produced at a pre-determined distance from the target patterns. In some embodiments, computing the diffraction pattern can comprise computing an interference pattern between a coherent reference wave front and wave fronts diffracted or scattered by the target patterns.

In some embodiments, determining the mask patterns can comprise determining contours by comparing image intensity of the in-line hologram with a threshold, and determining the mask patterns based on the contours. In some embodiments, the threshold can be a constant threshold. In some embodiments, the threshold can be a variable threshold whose value is defined by a function, and wherein one or more coefficients used in the function are fitted based on measurements of one or more printed test patterns. In some embodiments, the function can include a polygon density term that is computed at a point in the mask layout by dividing an aggregate area of polygons that are located within an ambit of the point by the total area of the ambit. Once the mask patterns have been determined, they can be provided to a semiconductor manufacturing facility for printing the target patterns on a semiconductor wafer by using the semiconductor manufacturing process.

DETAILED DESCRIPTION

Figure 1A:
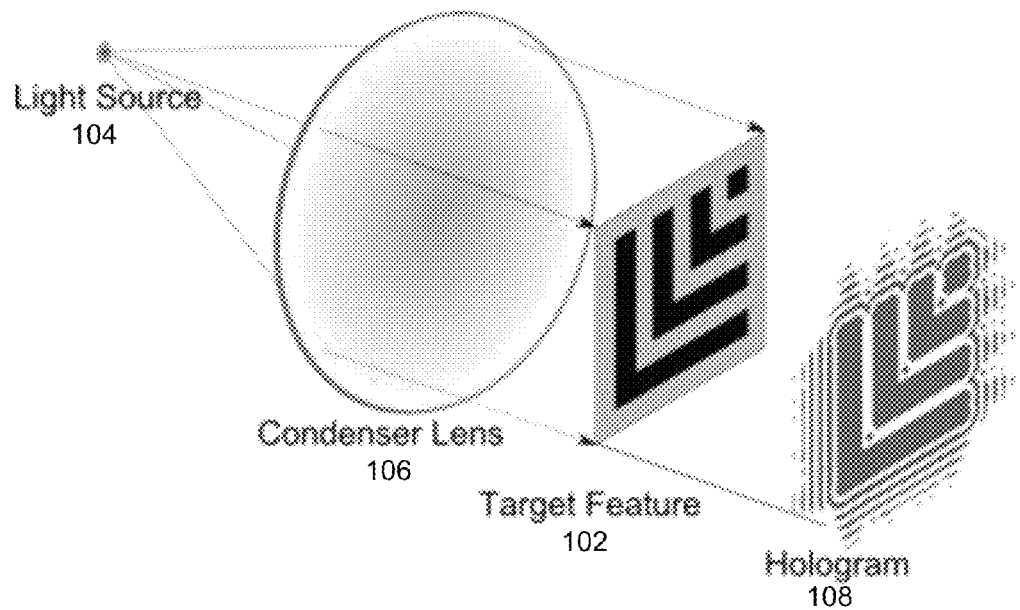
FIGS. 1A-1B illustrates the general idea of HIT in accordance with some embodiments described herein.

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the present invention. Thus, the present invention is not limited to the embodiments shown, but is to be accorded the widest scope consistent with the principles and features disclosed herein.

Overview of an EDA Flow

Circuit designs are typically created using an EDA flow. Once the circuit design is finalized, it can undergo fabrication, packaging, and assembly to produce integrated circuit chips. An EDA flow can include multiple steps, and each step can involve using one or more EDA software tools. Some EDA steps and software tools are described below. These examples of EDA steps and software tools are for illustrative purposes only and are not intended to limit the embodiments to the forms disclosed.

Some EDA software tools enable circuit designers to describe the functionality that the circuit designers want to implement. These tools also enable circuit designers to perform what-if planning to refine functionality, check costs, etc. During logic design and functional verification, the HDL (hardware description language), e.g., Verilog, code can be written and the design can be checked for functional accuracy, e.g., the design can be checked to ensure that it produces the correct outputs.

During synthesis and design for test, the HDL code can be translated to a netlist using one or more EDA software tools. Further, the netlist can be optimized for the target technology, and tests can be designed and implemented to check the finished chips. During netlist verification, the netlist can be checked for compliance with timing constraints and for correspondence with the HDL code.

During design planning, an overall floorplan for the chip can be constructed and analyzed for timing and top-level routing. During physical implementation, circuit elements can be positioned in the layout and can be electrically coupled.

During analysis and extraction, the circuit's functionality can be verified at a transistor level and parasitics can be extracted. During physical verification, the design can be checked to ensure correctness for manufacturing, electrical issues, lithographic issues, and circuitry.

During resolution enhancement, geometric manipulations can be performed on the layout to improve manufacturability of the design. Some embodiments disclosed herein can be used during resolution enhancement. During mask data preparation, the design can be "taped-out" to produce masks, which are used during fabrication.

RETs Based on HIT

Some embodiments described herein feature RETs based on HIT. These embodiments do not require conventional rigorous or compact models for OPC correction, but instead is purely based on illumination system and free space propagation of the mask. The corrected mask is validated with compact/rigorous models. The proposed method consists of two steps. First, an in-line hologram (Gabor hologram) is generated by computing the diffraction pattern of the target pattern (the interference of a coherent reference wave front with the wave fronts diffracted or scattered by a target pattern). Second, the computed hologram is synthesized to form a mask for a conventional optical system. The effectiveness of the proposed approach in terms of mask correction speed and accuracy is compared to conventional OPC and ILT correction methods through computational experiments.

The objective of optical lithography process modeling is to create a mathematical model which will be used to manipulate the geometries of input design polygons to improve pattern fidelity on a printed wafer. Sub-resolution optical systems will typically distort the mask pattern's image on the wafer due to diffraction effects. The printed image distortions, called proximity effects, create serious critical dimension (CD) control problems for integrated circuit (IC) layouts and hence it is necessary to adjust the original mask layout design to remove the proximity effects. The image distortion origins can be divided into two mathematically significant sources: proximity effects, which are optical and mainly due to the light diffraction, and resist effects. There are also several other secondary sources which introduce imperfection or distortions into the final pattern. These additional effects mainly come from the optical lithography system itself. The illumination system's lens quality and alignment have a critical influence on how the mask image is transferred to the wafer. There are several factors that can potentially have an influence on the quality of the final pattern and hence corresponding corrections are necessary for successful pattern transfer. Embodiments described herein correct for optical (diffraction) effects. The optical systems imperfection and any other mechanical sources of image degradation can be corrected separately.

In order to compensate for the above mentioned image distortions, mathematical models of semiconductor processes (capable of simulating of the whole lithography process) are used to design and to modify the device pattern to better image the desired pattern onto a wafer. To accomplish these tasks, different model types are developed including molecular models, bulk models, and compact models. All models and model applications must resolve the interaction between the competing effects of model computation time and model accuracy. Compact models are a special type of model that trades model fidelity for extreme runtime, which allows the model form to be used to model every feature on an entire chip for the purposes of OPC.

The goal of OPC is to compensate optical, photoresist and other known effects by making appropriate modifications to the photolithography mask. The OPC problem can be formulated as follows: For a given final desired pattern on the wafer, find an input mask design which will generate the desired pattern after all the lithographic steps and photoresist processing.

Three types of OPC techniques are widely used for mask modifications: rule-based, model-based, and inverse lithography techniques. Rule-based approaches are derived through experiment or simulation to determine specific corrections that should be applied to a given structure in a specific environment. Rule-based OPC approaches are typically fast, but unfortunately they are not as accurate as desired. Model-based OPC employs mathematical models to represent the image formation process of the optical lithography system. The model is used to gather specific information to modify edges on the mask to improve the output pattern fidelity on the wafer. Model-based OPC techniques are typically more rigorous correction solutions than rules, but can require longer OPC time due to intensive calculations and simulations. ILT is pixel-based manipulation of the image, while the classic model-based OPC is edge-based. Key distinctive feature of ILT include the de-emphasis of pattern-dependent heuristics, the ability to broadly explore wide areas of solution space and the ability to generate SRAFs in the same process as the main layer of the mask is modified. All of these OPC correction techniques are iterative and require significant computation and engineering resources. Moreover, rule-based and model-based approaches require laborious script-writing, which becomes more complex for newer generations because of more complicated proximity effects. Further increasing computational complexity, SRAFs are also added to increase pattern printability and the correct placement of assist features plays critical role. Hence there is a need for an efficient and easy method for performing OPC corrections.

This disclosure presents a new OPC mask correction approach that is based on holographic imaging technique. Note that there exists a similarity between traditional OPC corrected patterns and synthesized holographic pictures or Fresnel zone plate fringes. Expanding upon this observation, one can associate the OPC corrected mask pattern to a diffraction picture of that mask pattern. This observation is more apparent when ILT techniques are applied the pattern (the ILT solution space has orders of magnitude more degrees of freedom than a traditional OPC correction). This leads to a new possibility for a novel approach for OPC correction, and more specifically for holographic imaging techniques (HIT) which can find an input mask design capable of printing the desired pattern after all the lithographic steps and photoresist processing.

Figure 1B:
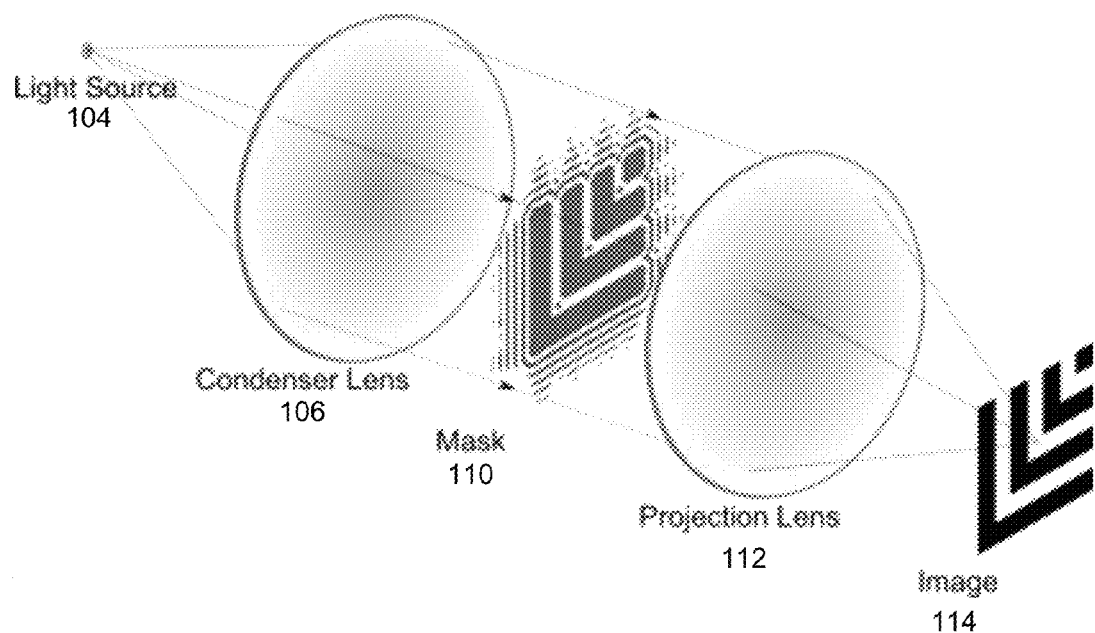

FIGS. 1A-1B illustrates the general idea of HIT in accordance with some embodiments described herein. An arbitrary object (e.g., target feature 102), located in front of illumination source (e.g., light source 104) and condenser lens 106, forms diffraction pattern at distance d from the object. The diffraction pattern combined with non-diffracted light forms an in-line Gabor hologram 108, which can be recorded on film. In principle, if the recorded hologram (e.g., mask 110) is illuminated (e.g., using light source 104 and condenser lens 106) with same coherent plane wave the original target (e.g., image 114) can be reconstructed (e.g., using projection lens 112) at the same distance d from the hologram.

The basic computational steps of the HIT method can be described as a two step process. First, an in-line hologram (Gabor hologram) is generated by computing the diffraction pattern of the target pattern (the interference of a coherent reference wave front with the wave fronts diffracted or scattered by a target pattern). Second, the computed hologram is synthesized to form a mask. The synthesized hologram can be used as a mask in a conventional optical projection system, and if the hologram is calculated to include the optical system's exposure and projection parameters, the generated hologram is capable of delivering sufficient information to reconstruct the desired target patterns.

The aerial image can be considered as a first order approximation to a resist model, and hence the wafer photoresist effects (acid/base diffusion and development processes) are not included in the following discussion. Also, a simple illumination optical system with circular source is chosen for experimental demonstration of the proposed methodology. The HIT based approach is a novel, relatively simple and fast OPC correction approach that can rapidly find for the optimal photomask design and is suitable for use in a production environment, without need of major changes in existing photomask making steps. Key distinctive features of HIT are a one step process (no iterative process needed), and correct placement of SRAFs and absence of pattern shape dependency. HIT leads to mask patterns which can be associated with a diffraction image (hologram) of the desired pattern, and completely solves the problem of SRAF placement (additional mask features intended to enhance the lithographic transfer qualities of the main feature). With traditional OPC, SRAFs are typically placed empirically, and during iterative OPC these are not changed or modified (only main layer is modified). On other hand, the more advanced ILT approach can determine the correct placement of SRAFs simultaneously along with the main mask layer. In contrast, HIT is capable of determining in one step the best possible placement locations of SRAFs, as well as the correct size for each SRAF. HIT offers the freedom to control how small SRAFs should be generated, which could be used as a knob to control the minimum size of the mask features of the HIT generated OPC mask, which is in most cases dictated by the limitations of the mask fabrication Like ILT, HIT doesn't require extensive script writing, which is a significant advantage and reduces the required engineering resources.

The optical system used in photolithography is one of the well-studied and well-represented steps in the photolithography compare to other parts/components of the mathematical lithographic models such as resist. The extended source method is used to predict the aerial image of a partially coherent diffraction limited or aberrated projection system based on scalar and/or vector diffraction theory. Single wavelength or broadband illumination can be used. The standard image model accounts for the important effect of image defocus through the resist film. The optical system aerial image is widely modeled using a Hopkins model for general scalar imaging formulation, and the model's parameters and coefficients are found using collected metrology data from the manufacturing process in the wafer fab. The Hopkins model is a simplified and approximate version of the Abbe's model, where the integration over the source is done before summing up the diffraction angles accepted by the lens. This makes the model form extremely compact and allows the image to vary, making it an ideal choice for OPC calculations. The aerial image intensity delivered at the imaging plane of the optical system is calculated numerically and can be expressed with the Hopkins equation as shown below:

$$I(x,y)=\iiiint M(x_1,y_1)T(x-x_1,y-y_1;x-x_2,y-y_2)M^*(x_2,y_2)\,dx_1dx_2dy_1dy_2 \quad (1)$$

where $M(x,y)$ is the mask transmission function (binary dark field mask is assumed through the study), $T(x-x_1,y-y_1, x-x_2,y-y_2)$ is the so-called transmission cross coefficient (TCC). The above equation for a coherent illumination can be expressed also as:

$$I(x,y)=M \otimes PSF \quad (2)$$

where $M(x,y)$ is the mask pattern and the PSF is the point spread function of the optical system. In other words, the Hopkins model simply is a convolution of the source point spread function with the mask pattern. The PSF is the three-dimensional diffraction pattern of light emitted from an infinitely small point source transmitted to the image plane through a high numerical aperture (NA) optical system.

The optical system is incapable of focusing the emitted light at an infinitely small point in the image plane, instead the image at the focal plane converges into a diffraction pattern known as the Airy disk which together with the series of concentric bright rings around is called the Airy pattern. The radius of the central disk (Airy disk) is determined by the optical system's NA and is the resolution limit of the system. In the real world environment, the optical system's imperfections, such as lens aberrations, affect the diffraction pattern at the axial plane. In the following discussion, an optical system with no aberrations and coherent illumination are assumed. An Airy pattern's resolution is the key factor in image formation process. Essentially higher the system's NA the more pattern information is available to recreate the original object at the image plane. This leads to the conclusion that if one can increase an optical system's overall NA then less mask OPC correction will be needed. But at the same time mask itself can be considered as an optical element, and by looking into typical ILT or model-based OPC corrected masks, it can be easily observed that the modified (corrected) mask features have fringes around them, which mimic Fresnel zone plates. Essentially, by turning the mask into an object that not only scatters and diffracts the incoming illumination but also serves as a focusing optical element a system is produced that in combination with the optical projection system increases the total mask+optical system NA. Due to the fact that an optical projection system is a bandwidth limited system it is obvious that the printed image will always drop high frequency pattern components, such as corners, and hence never will be able to completely achieve the desired pattern shape.

Let us assume there is no optical projection system and no lens system, but instead assume the simpler case when a point object is illuminated with a coherent wavefront forming a diffraction pattern at a distance d identical to the one that can be obtained with an optical system. If the diffraction pattern can be turned into a hologram (by recording both amplitude and phase information) it is possible to do the inverse experiment, where the hologram forms the target point. The diffraction pattern interfered with coherent reference wavefront forms an in-line hologram (or Gabor hologram). Holography is based on the Huygens-Fresnel principle of light propagation and provides a way of recording and capturing both phase and amplitude of the wavefront. In reverse, when a coherent wave front interferes with the hologram, the reconstruction of the object is formed at the imaging plane of the hologram, i.e., where the real object was originally located.

The Gabor diffraction pattern shape can be associated with an Airy pattern. Both are concentric rings around a central disk. Also, by considering the fact that in an Airy pattern more than 85% of the total light intensity is contained in the central disk (central disk with first ring~90%, the relatively small outer rings of the Airy pattern can be ignored) one can try to match Gabor's central disk with the Airy one. The intensity the Airy pattern is given by the squared modulus of the Fourier transform of the circular aperture:

$$I(r) = I_0 \left( \frac{2J_1\left(\frac{2\pi NA}{\lambda}r\right)}{\frac{2\pi NA}{\lambda}r} \right)^2 \quad (3)$$

where $I_0$ is the maximum intensity of the pattern at the Airy disc center, $J_1$ is the Bessel function of the first kind of order one, $\lambda$ is the illumination wavelength, r is the radial distance from the optics axis in the observation (or focal) plane. The Airy's central disk radius is equal to:

$$r_{Airy} = 0.61 \frac{\lambda}{NA} \quad (4)$$

The Gabor zone plate central disk's radius can be defined as:

$$r_{GZP} = \frac{\sqrt{\lambda d}}{k_2} \quad (5)$$

where d is the focal length of Gabor zone plate (or propagation distance in order to generate a Gabor hologram, where the central disk has radius $r_{GZP}$), $k_2$ scaling factor (current optical systems scaling factor is equal to 4). Using Eq. (4) and Eq. (5), and forcing the central disks' radii to be equal, the focal length of the Gabor zone plate can be defined as:

$$d = \lambda \left( 0.61 \frac{k_2}{NA} \right)^2 \quad (6)$$

Figure 2:
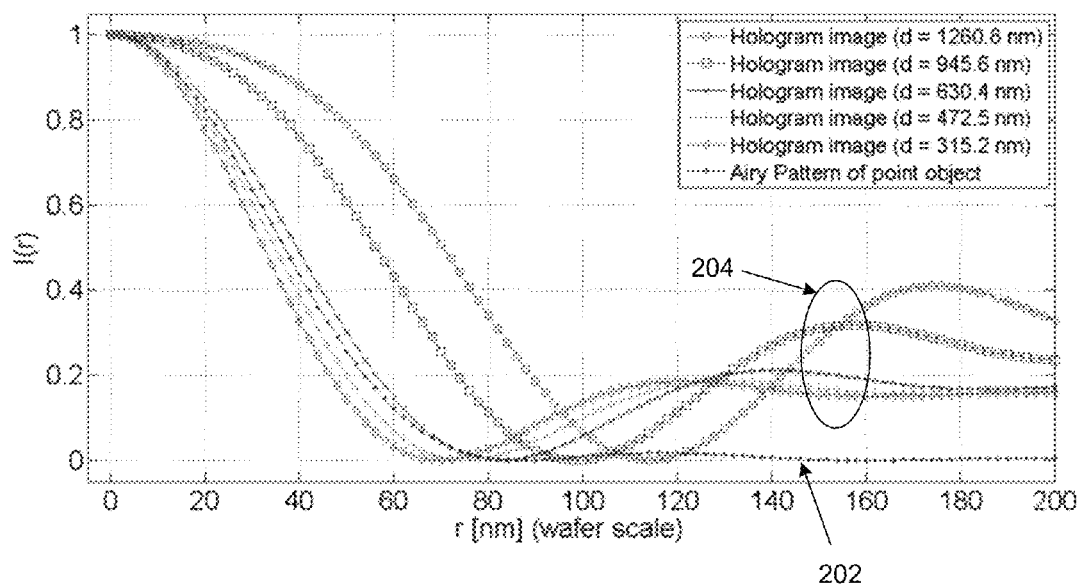
FIG. 2 illustrates the intensity of the Airy patterns with respect to distance in accordance with some embodiments described herein.

Thus, by propagating the point object to distance d, the synthesized Gabor hologram's (or Gabor zone plate's) central disk will have the exact same radius as the Airy disk of the optical system with a numerical aperture NA. Now, if the synthesized hologram is imaged by the optical system, which according to Eq. (2), is simply a convolution of the Gabor hologram with the Airy pattern, then another Airy style pattern will be formed. FIG. 2 illustrates the intensity of the Airy patterns with respect to distance in accordance with some embodiments described herein. Curve 202 corresponds to the Airy pattern of the optical system with NA=1.35, illumination wavelength 193 nm with scaling factor of 4. Curves 204 correspond to the aerial image intensity distribution of printed Gabor holograms that are calculated at distances varying from 0.25*d to 2*d. Note that the curves have been normalized for convenience purposes.

As it can been seen from FIG. 2, the image of the Gabor hologram starting from the d=472.5 nm gets narrower than the Airy pattern of the point, which essentially means that Gabor hologram+optical system's total NA has been increased.

In order to justify the increase of the total NA of the hologram+optical system, an experiment can be conducted to demonstrate the resolving power of the combined system. Two delta points located 85 nm (wafer scale) apart from each other can be imaged by the optical system with NA of 1.35 and NA of 1.52 correspondingly with reduction factor of 4. Meantime, corresponding hologram (calculated at propagation distance d=472.5 nm) can be imaged with the optical system with NA of 1.35 with reduction factor of 4. The results of this experiment show that the hologram+optical system with NA of 1.35 are capable of resolving two points similar to an optical system which NA is 1.52. Thus the corresponding total NA for the hologram combined with optical system of 1.35 NA is equal to 1.52, which is 12.6% increase of NA, and could potentially extend the current optical projection systems lifespan by enabling to image smaller CDs without need of hardware upgrade. Also, the contrast of the printed image has been increased from 0.2 to 0.6. This is clearly a remarkable achievement, and justifies the correctness of the HIT approach. In other words, HIT technique can be considered as a resolution enhancement technique (RET), hence can be applied for full-chip corrections in a complete novel way.

Some embodiments solve the inverse problem comprised of a deconvolution of the narrower Airy pattern with optical system's point spreads function, to determine an input diffraction pattern that will result in the design pattern at the image plane. This gives a chance to find a diffraction pattern which takes into consideration the optical system's illumination source, projection lens's aberration, apodization and other systemic image distortion effects (including resist effects).

The HIT technique uses these principles to generate a mask in a process consisting of two steps: generate a Gabor hologram of the target features; synthesize the diffraction pattern to form a new mask (binary or phase shifting mask). Moreover, during hologram generation it is possible to add some of the optical system's image distortion affects as well as various illumination sources, concepts which will be addressed in follow on studies. Also the hologram synthesizing process can be tuned for mask fabrication requirements, in order to output mask that is manufacturable. The synthesized hologram of the target mask can be considered as a mask that in combination with the optical system increases the total system's NA, and as a result will increase the target image reconstruction fidelity. Essentially the synthesized hologram mask captures more high order diffracted light in the optical system's projection system, which increases the information available for image reconstruction. Using similar approaches, it is possible to fabricate phase shifting synthesized holograms, since the calculated hologram contains both phase and amplitude information. An advantage of the embodiments disclosed herein is that the desired mask (to form target features) can be calculated with a one step process and doesn't require any iterative process and hence is computationally efficient compared to current OPC techniques.

Consider a test pattern with feature sizes varying from 50 nm to 100 nm. The test features are drawn one a binary dark field mask (non-transparent background, while the main features have an intensity transmission of 100%). In order to generate the HIT mask two consecutive operations are performed. A plane wave in normal incidence has been illuminated thorough the test features and the diffraction pattern at distance d=472.5 nm interfered with the non-diffracted plane wave used to record the hologram by calculating the intensity distribution, i.e., $(1+E_{real})^2+E_{imag}^2$, are the real and imaginary parts of the diffracted light's electrical field. The recorded hologram is an in-line (Gabor) hologram. Because of the planar mask fabrication procedure, the hologram must be converted to a binary structure rather than a normal holographic continuous tone object, even though in some cases it is possible to fabricate a continuous tone mask. However, continuous masks add extremely tight requirements on the mask fabrication process rendering them practical in high volume manufacturing. The hologram can be converted to a phase shifting object, or a binary dark field mask. Specifically, the hologram can be converted to a binary mask (synthesized) by thresholding the image using a threshold. The thresholding can be constant thresholding. Alternatively, nonlinear thresholding or variable thresholding can be used to add more degrees of freedom in the hologram synthesis process.

To demonstrate the HIT technique, a corrected mask was imaged by an optical exposure system with a 0.95 sigma circular source. The optical exposure system had a wavelength of 193 nm and an NA of 1.35, reduction factor of 4. The source was non-polarized and no aberrations were considered in the projection system. The corrected binary dark field mask was then placed into an optical exposure system.

One of the advantages of the HIT corrected mask is that the generated SRAFs are perfectly positioned. In the HIT placement, SRAFs contribute to enhance the intensity of the main layer while destructive interference lowers the aerial image intensity at SRAFs locations themselves. This is important for process performance because HIT generated SRAFs will have significantly less AF printability problems than traditional SRAF placement techniques. In HIT based approaches, the aerial image intensity distribution along a contact hole is evenly distributed across the contact hole main layer and the SRAFs. Additionally, in HIT based approaches there are no intensity inflections over the SRAFs as typically observed when SRAFs are placed by traditional rule/model-based OPC techniques.

Figure 3:
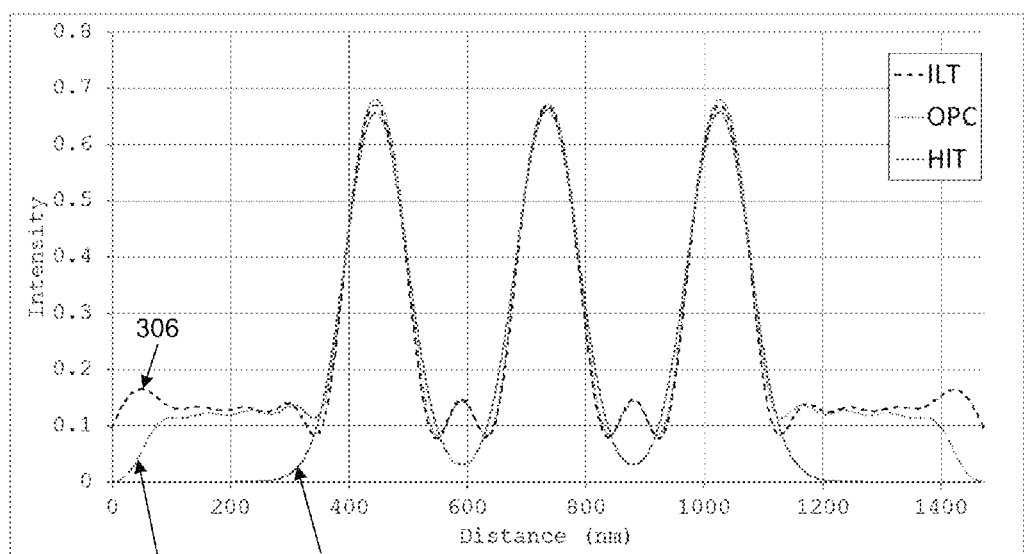
FIG. 3 illustrates aerial image intensity distribution of corrected patterns using model-based OPC, inverse lithography technology (ILT), and HIT in accordance with some embodiments described herein.

To demonstrate this point, model-based and ILT correction techniques were used to make optical proximity corrections for test pattern (target CD is 90 nm) and compared to the same pattern corrected with the HIT process. FIG. 3 illustrates aerial image intensity distribution of corrected patterns using model-based OPC, ILT, and HIT in accordance with some embodiments described herein. As can be seen from the aerial image intensity distribution plot (curves 302, 304, and 306 correspond to HIT, OPC, and ILT, respectively), the HIT corrected mask's SRAFs have reduced the background signal which improves the overall pattern printability. For this specific example the aerial image contrast values are 0.66, 0.67 and 0.88 for ILT, model based OPC, and HIT technique correspondingly. But the same time, if one will look into the mask error enhancement factor (MEEF), the ILT and model based OPC have MEEF close to 1.5, while HIT corrected mask MEEF is ~3. This can be explained by the fact that for MEEF calculation the SRAFs play critical role, and in case of HIT as it can be seen from the generated masks, the SRAFs are located close to main layer, which limits the edge variation. In addition to a nominal model, two more models (defocus of the optical system changed to +/−50 nm off from nominal best defocus position) were used to measure process latitude of HIT corrected masks. The Aerial image contrast reduced from 0.88 down to 0.81 when the optical defocus was shifted by 50 nm, while the CD has been changed by only 6.5% from target value.

In summary, HIT is a novel RET technique, relatively simple and fast OPC correction approach that can rapidly find for the optimal photomask design and is suitable for use in a production environment, without need of major changes in existing photomask making steps. HIT technique is a two-step computational process. HIT generates correctly placed SRAFs and improves the wafer printability fidelity. HIT based approaches do not depend on the pattern shape. Also, HIT doesn't require extensive script writing, which significantly reduces the required engineering need. HIT based approaches require a single step (as opposed to being iterative) and the runtime required for mask OPC correction based on HIT is substantially smaller than the runtime required by either model-based OPC or ILT techniques.

Figure 4A:
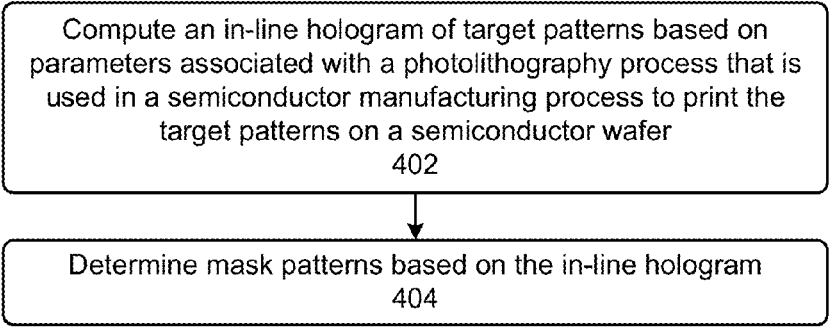
FIGS. 4A-4B illustrate a process for determining mask patterns so that patterns printed on a semiconductor wafer by using a semiconductor manufacturing process are substantially similar to target patterns that are desired to be printed on the semiconductor wafer in accordance with some embodiments described herein.
Figure 4B:
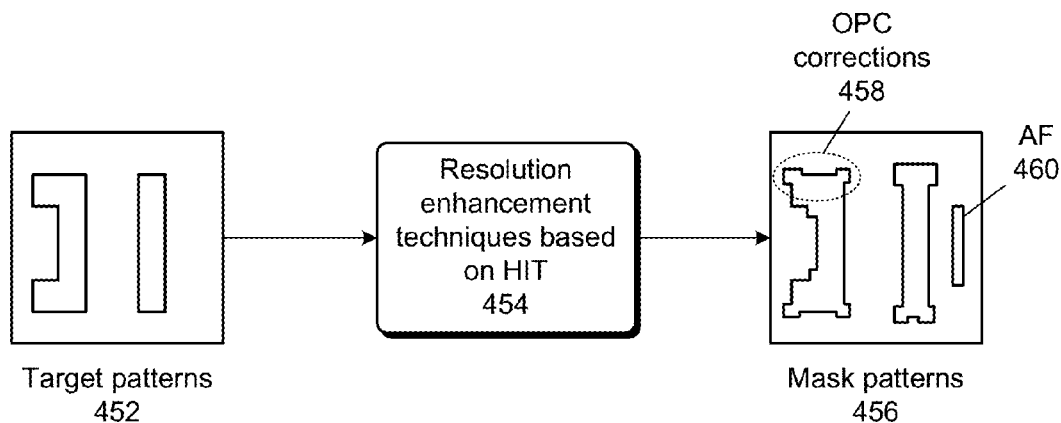

FIGS. 4A-4B illustrate a process for determining mask patterns so that patterns printed on a semiconductor wafer by using a semiconductor manufacturing process are substantially similar to target patterns that are desired to be printed on the semiconductor wafer in accordance with some embodiments described herein. The process can begin by computing an in-line hologram of target patterns based on parameters associated with a photolithography process that is used in a semiconductor manufacturing process to print the target patterns on a semiconductor wafer (operation 402). In some embodiments, computing the in-line hologram can involve computing a diffraction pattern that is produced at a pre-determined distance from the target patterns. In some embodiments, computing the diffraction pattern can involve computing an interference pattern between a coherent reference wave front and wave fronts diffracted or scattered by the target patterns.

Next, the process can determine the mask patterns based on the in-line hologram (operation 404). Specifically, the process can determine contours by comparing image intensity of the in-line hologram with a threshold, and determine the mask patterns based on the contours. In some embodiments, the threshold can be a constant threshold. In other embodiments, the threshold can be a variable threshold whose value is defined by a function, and wherein one or more coefficients used in the function are fitted based on measurements of one or more printed test patterns. For example, the critical dimensions of printed test patterns can be measured, and this measurement data can be used to fit the coefficients in the function so that the critical dimensions of the predicted contours match the measured critical dimensions. In some embodiments, the function includes a polygon density term that is computed at a point in the mask layout by dividing an aggregate area of polygons that are located within an ambit of the point by the total area of the ambit. Once the mask patterns have been determined, they can be provided to a semiconductor manufacturing facility for printing the target patterns on a semiconductor wafer by using the semiconductor manufacturing process.

As shown in FIG. 4B, target patterns 452 can be provided as input to one or more RETs based on HIT 454. For example, the RETs can include one or more of OPC, AF placement, SRAF placement, etc., and the RETs can be performed by an EDA tool that executes on a computer. The output of the RETs can be mask patterns 456 that include OPC corrections 458 and assist features 460. The output can then be used to generate photolithography masks.

Computer System

Figure 5:
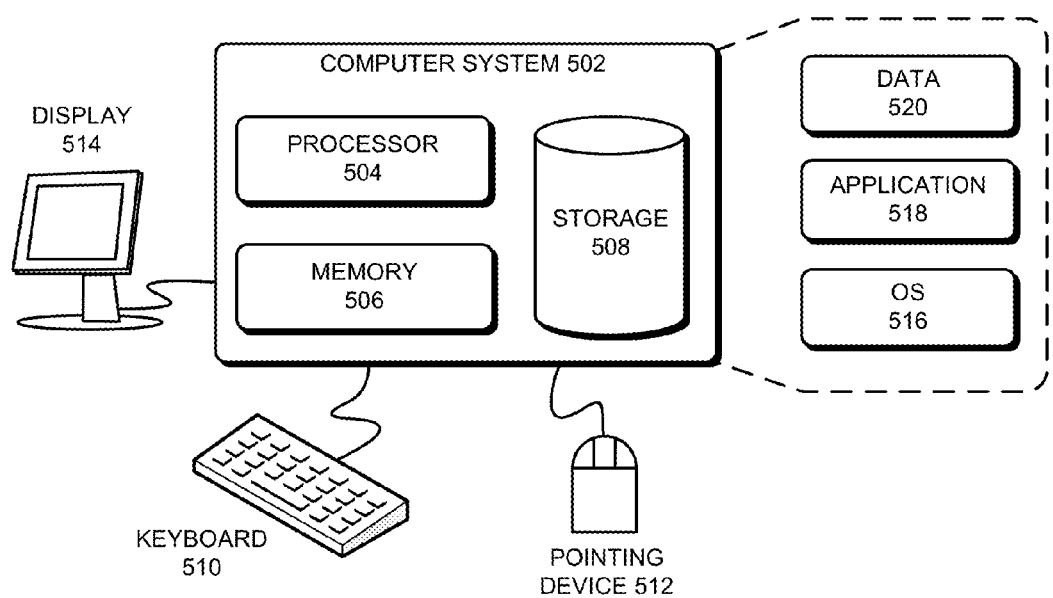
FIG. 5 illustrates a computer system in accordance with some embodiments described in this disclosure.

FIG. 5 illustrates a computer system in accordance with some embodiments described in this disclosure. Computer system 502 can include processor 504, memory 506, and storage device 508. Computer system 502 can be coupled to display device 514, keyboard 510, and pointing device 512. Storage device 508 can store operating system 516, application 518, and data 520. Data 520 can include input required by application 518 and/or output generated by application 518. Computer system 502 may automatically (or based on user input) perform one or more operations that are implicitly or explicitly described in this disclosure. For example, computer system 502 can load application 518 (e.g., an EDA tool) into memory 506, and application 518 can then be used to perform a process (e.g., the process illustrated in FIG. 4A) implicitly or explicitly described in this disclosure.

CONCLUSION

The above description is presented to enable any person skilled in the art to make and use the embodiments. Various modifications to the disclosed embodiments will be readily apparent to those skilled in the art, and the general principles defined herein are applicable to other embodiments and applications without departing from the spirit and scope of the present disclosure. Thus, the present invention is not limited to the embodiments shown, but is to be accorded the widest scope consistent with the principles and features disclosed herein.

The data structures and code described in this disclosure can be partially or fully stored on a computer-readable storage medium and/or a hardware module and/or hardware apparatus. A computer-readable storage medium includes, but is not limited to, volatile memory, non-volatile memory, magnetic and optical storage devices such as disk drives, magnetic tape, CDs (compact discs), DVDs (digital versatile discs or digital video discs), or other media, now known or later developed, that are capable of storing code and/or data. Hardware modules or apparatuses described in this disclosure include, but are not limited to, application-specific integrated circuits (ASICs), field-programmable gate arrays (FPGAs), dedicated or shared processors, and/or other hardware modules or apparatuses now known or later developed.

The methods and processes described in this disclosure can be partially or fully embodied as code and/or data stored in a computer-readable storage medium or device, so that when a computer system reads and executes the code and/or data, the computer system performs the associated methods and processes. The methods and processes can also be partially or fully embodied in hardware modules or apparatuses, so that when the hardware modules or apparatuses are activated, they perform the associated methods and processes. Note that the methods and processes can be embodied using a combination of code, data, and hardware modules or apparatuses.

The foregoing descriptions of embodiments of the present invention have been presented only for purposes of illustration and description. They are not intended to be exhaustive or to limit the present invention to the forms disclosed. Accordingly, many modifications and variations will be apparent to practitioners skilled in the art. Additionally, the above disclosure is not intended to limit the present invention. The scope of the present invention is defined by the appended claims.

What is claimed is:

1. A non-transitory computer-readable storage medium storing instructions for an electronic design automation (EDA) tool that, when executed by a computer, cause the computer to perform a method to determine mask patterns so that patterns printed on a semiconductor wafer by using a semiconductor manufacturing process are substantially similar to target patterns, the method comprising:
   computing an in-line hologram of the target patterns based on parameters associated with a photolithography process that is used in the semiconductor manufacturing process;
   determining contours by comparing image intensity of the in-line hologram with a threshold; and
   determining the mask patterns based on the contours.

2. The non-transitory computer-readable storage medium of claim 1, wherein computing the in-line hologram comprises computing a diffraction pattern that is produced at a pre-determined distance from the target patterns.

3. The non-transitory computer-readable storage medium of claim 2, wherein computing the diffraction pattern comprises computing an interference pattern between a coherent reference wave front and wave fronts diffracted or scattered by the target patterns.

4. The non-transitory computer-readable storage medium of claim 1, wherein the threshold is a constant threshold.

5. The non-transitory computer-readable storage medium of claim 1, wherein the threshold is a variable threshold whose value is defined by a function, and wherein one or more coefficients used in the function are fitted based on measurements of one or more printed test patterns.

6. The non-transitory computer-readable storage medium of claim 5, wherein the function includes a polygon density term that is computed at a point in the mask layout by dividing an aggregate area of polygons that are located within an ambit of the point by the total area of the ambit.

7. The non-transitory computer-readable storage medium of claim 1, further comprising providing the mask patterns to a semiconductor manufacturing facility for printing the target patterns on a semiconductor wafer by using the semiconductor manufacturing process.

8. An apparatus, comprising:
   a processor; and
   a non-transitory storage medium storing instructions for an electronic design automation (EDA) tool that, when executed by the processor, cause the apparatus to perform a method to determine mask patterns so that patterns printed on a semiconductor wafer by using a semiconductor manufacturing process are substantially similar to target patterns, the method comprising:
   computing an in-line hologram of the target patterns based on parameters associated with a photolithography process that is used in the semiconductor manufacturing process;
   determining contours by comparing image intensity of the in-line hologram with a threshold; and
   determining the mask patterns based on the contours.

9. The apparatus of claim 8, wherein computing the in-line hologram comprises computing a diffraction pattern that is produced at a pre-determined distance from the target patterns.

10. The apparatus of claim 9, wherein computing the diffraction pattern comprises computing an interference pattern between a coherent reference wave front and wave fronts diffracted or scattered by the target patterns.

11. The apparatus of claim 8, wherein the threshold is a constant threshold.

12. The apparatus of claim 8, wherein the threshold is a variable threshold whose value is defined by a function, and wherein one or more coefficients used in the function are fitted based on measurements of one or more printed test patterns.

13. The apparatus of claim 12, wherein the function includes a polygon density term that is computed at a point in the mask layout by dividing an aggregate area of polygons that are located within an ambit of the point by the total area of the ambit.

14. The apparatus of claim 8, further comprising providing the mask patterns to a semiconductor manufacturing facility for printing the target patterns on a semiconductor wafer by using the semiconductor manufacturing process.

15. In an electronic design automation (EDA) tool, a method to determine mask patterns so that patterns printed on a semiconductor wafer by using a semiconductor manufacturing process are substantially similar to target patterns, the method comprising:

computing an in-line hologram of the target patterns based on parameters associated with a photolithography process that is used in the semiconductor manufacturing process;

determining contours by comparing image intensity of the in-line hologram with a threshold; and determining the mask patterns based on the contours.

16. The method of claim 15, wherein computing the in-line hologram comprises computing a diffraction pattern that is produced at a pre-determined distance from the target patterns.

17. The method of claim 16, wherein computing the diffraction pattern comprises computing an interference pattern between a coherent reference wave front and wave fronts diffracted or scattered by the target patterns.

* * * * *